May 16, 1967 A. OSWALD 3,319,319

METHOD OF MAKING A PRINTED CIRCUIT BOARD

Filed Feb. 11, 1965

ANTON OSWALD
INVENTOR

BY Sal. A. Giarratana
George B. Oujevolk
ATTORNEYS 3,319,319
Patented May 16, 1967

3,319,319
METHOD OF MAKING A PRINTED CIRCUIT BOARD

Anton Oswald, Farmington, Conn., assignor to General Precision, Inc., Little Falls, N.J., a corporation of Delaware Filed Feb. 11, 1965, Ser. No. 431,965
2 Claims. (Cl. 29—155.5)

This application is a continuation-in-part of pending application Ser. No. 162,858, filed Dec. 28, 1961, now abandoned.

This invention relates to printed circuit boards, and more particuluarly to a printed circuit board having weldable pins therein to facilitate the welding of circuit component leads to the board.

Prior to the present invention, welded electronic circuit packages were manufactured by forming nickel ribbon wire in the shape of the interconnection between the circuit components and welding the circuit component leads to the nickel ribbon wire. The basic disadvantage of this method is that it is time-consuming. Extra handling of parts is required in that the ribbon wire must be formed from one point of connection to the next in the welding operation and the ribbon wire must be cut after the welding has been completed.

Another method of the prior art makes use of a deposited circuit on a board, the circuit components being welded to tabs formed as a part of the deposited circuit. This method is unsatisfactory because the board on which the deposited circuit is formed is brittle, and the deposited circuit does not adhere to the board very well. This makes the welded circuit difficult and troublesome both to manufacture and to repair. The deposited circuit often peels off during the welding operation or when the welded circuit is being repaired. Because the deposited circuit is dense, the circuit usually shorts whenever any peeling occurs. Moreover, the tabs of the deposited circuit occasionally break off, which necessitates the use of ribbon wire to complete the manufacture of the welded circuit package.

The present invention avoids the disadvantages of the prior art by providing a printed circuit board that can be incorporated as part of the welded circuit package and enables the leads from the different components of the package to be welded directly to the printed circuit board in a very effective manner. In accordance with one embodiment of the invention, weldable pins are molded directly in a thin board so as to project from one face thereof. A printed circuit pattern is provided on the opposite face of the board to electrically interconnect the pins. This is preferably accomplished by laminating a copper foil to the other face of the board by a conductive epoxy adhesive and photographically etching away the copper to form a completed printed circuit between the pins. The component leads may then be welded directly to the portions of the pins projecting from the face of the board furthest removed from the printed circuitry to eliminate the possibility of the circuitry being accidentally pulled away from the board during the welding operation.

Accordingly it is one object of the present invention to provide a printed circuit board that can have the leads from electronic components welded directly thereto.

It is another object of the invention to provide an improved method of manufacturing a printed circuit board with weldable pins integrally molded thereon to enable the leads of electronic components to be welded directly thereto.

It is a further object of the present invention to provide a printed circuit board of the type described above which lends itself to mass production techniques.

It is a still further object of the present invention to provide a printed circuit board of the type described above which is simple and economical to manufacture, effective in use, and enables electric component leads to be quickly and easily welded directly thereto without impairing the printed circuit on the board.

Other objects and features of novelty of the present invention will be specifically pointed out or will otherwise become apparent when referring, for a better understanding of the invention, to the following description taken in conjunction with the accompanying drawings, wherein.

Figure 2:
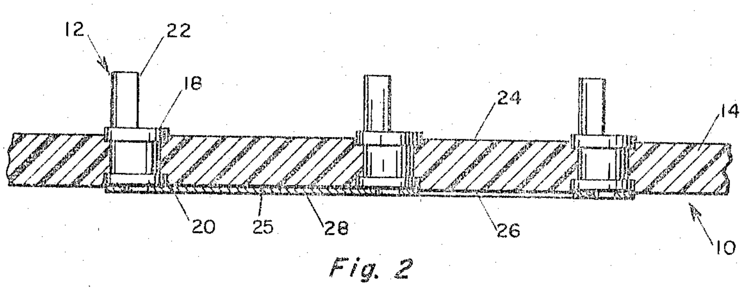
FIG. 2 is a side view of the printed circuit board illustrated in FIG. 1.
Figure 1:
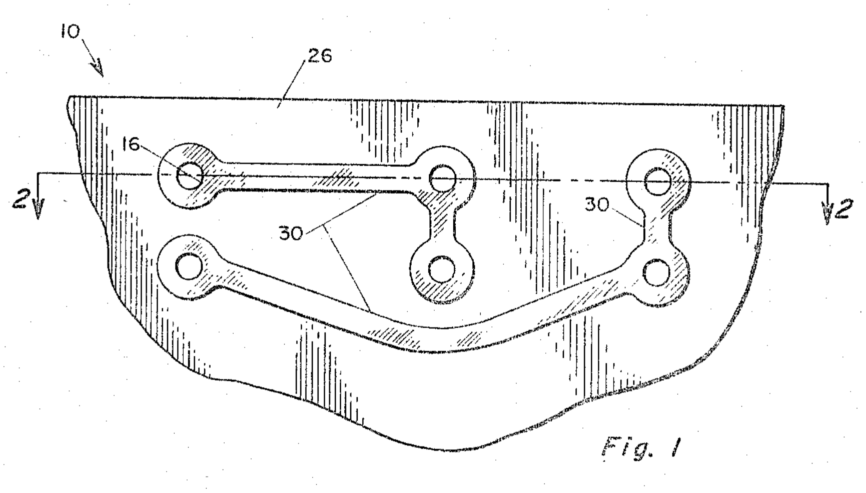
FIG. 1 is a fragmentary view of the under side of a printed circuit board embodying features of the present invention.
Figure 3:
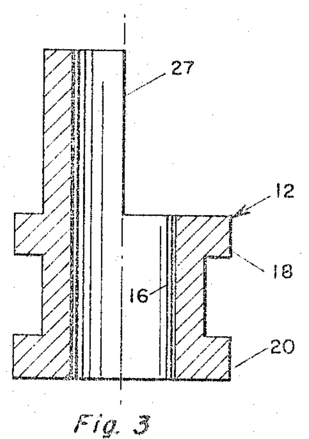
FIG. 3 is an enlarged longitudinal sectional view of one of the hollow pins used in the printed circuit board illustrated in FIG. 2.

Referring to the drawings, a printed circuit board 10 embodying features of the invention is illustrated which comprises a plurality of weldable hollow pins 12 in a thin board 14 of phenolic or plastic material, for example. Each of the pins has an aperture 16 extending therethrough with spaced flanges 18 and 20 exposed on opposite faces 24 and 26 of the board 14 to firmly lock the pins to the board which is molded thereabout. One half of the upper portion of each pin above the flanges 18 is removed to provide projections 22 projecting above the face 24 of the board.

Electrical continuity is provided between the pins 12 by a printed circuit pattern on the face 26 of the board. This printed circuit pattern may be provided in a number of different ways, such as by depositing it directly on the molded board, outlining the circuit in depressions on the board and filling the depressions with conductive material, transfer processing a circuit onto the molded board using an electrically conductive adhesive to make contact with the pins, or milling the circuit board and filling the milled portions of the board with a conductive material. However, as illustrated in the drawing, the printed circuit is preferably provided in still another way by bonding a layer 28 of suitable conducting material, such as copper foil, to the face 26 with a conductive epoxy adhesive. To this end, the conductive epoxy 25 is applied to face 26 of the board in the configuration of the desired printed circuit pattern. This may be accomplished by use of a mask which covers those areas of the surface where no adhesive is desired, or in any other suitable manner. The sheet of copper foil is then applied and adhered to face 26 of the board, thus establishing a good electrical connection between the layer 28 and each of the flanges 20 of the pins which are flush with the face 26. The layer 28 is then photographically etched away to provide the printed circuit paths 30 interconnecting the pins 12.

It will be appreciated that, while the conductive adhesive and etched foil conductors cover identical areas and, therefore, appear to be redundant, by the presence of the etched foil conductors the relatively higher electrical resistance of the adhesive is confined in its effect to the regions where it is interposed between the flanges 20 and the foil conductors. In these regions the current flow must traverse the adhesive layer, only through its thickness dimension and the resistance is, therefore, negligible. Lateral conduction between connection terminals takes place primarily in the etched foil circuit.

The purpose of confining the conductive adhesive to areas corresponding to the printed circuit pattern is to prevent shorting between foil conductors. An alternate means of accomplishing this object would be to apply to face 26, prior to coating with conductive adhesive, masking strips calculated to electrically isolate the conductors of the printed circuit pattern. Removal of the masking then leaves strips of surface 26 bare of adhesive separating the regions to which foil conductors are to be applied.

With this construction, leads from various electronic components can be extended through the aperture 16 in each of the pins and welded directly to the projections 22 so that the welding operation takes place on the side of the board opposite the printed circuit to eliminate the possibility of the printed circuit pattern being accidentally pulled away from the board or otherwise impaired by the welding operation. If desired, suitable electronic components could be positioned between two printed circuit boards 10 with the leads therefrom extending through and welded to the appropriate hollow pins 12, as described. All of this could then be encapsulated in a suitable insulating material to provide a hermetically sealed module.

While it will be apparent that the embodiment of the invention described above is well calculated to fulfill the objects of the invention, it will be appreciated that many changes, revisions and modifications may be made without departing from the spirit and scope of the invention as defined in the subjoined claims.

What is claimed is:

1. The method of manufacturing a printed circuit board, which includes the steps of, molding a board of insulating material about a plurality of pins having surfaces of irregular configuration, exposing a portion of each of said pins on one face of said board, bonding a layer of conductive material on said one face and the portions of said pins exposed thereon with an electrically conductive adhesive material applied in the configuration of the desired printed circuit pattern, and removing portions of said conducting material to form a printed circuit pattern interconnecting said pins.

2. The method of manufacturing a printed circuit board, which includes the steps of, providing a plurality of weldable hollow pins having an irregular configuration on portions of the surfaces thereof, molding a board about said portions of said pins to firmly lock them in spaced relation with one end thereof projecting above one face of said board and the other ends substantially flush with the other face of said board, forming a printed circuit pattern on said other face of the board electrically interconnecting each of said other ends of the pins by bonding a copper foil layer to said other face of the board with an electrically conductive epoxy adhesive applied in the configuration of the desired printed circuit pattern, and removing portions of said copper foil to form the printed circuit interconnecting said other ends of the pin.

References Cited by the Examiner

UNITED STATES PATENTS

| | | | |
|---|---|---|---|
| 2,603,681 | 7/1952 | Salisbury | 317—99 X |
| 3,143,787 | 8/1964 | Babbe | 174—68.5 X |

FOREIGN PATENTS

| | | |
|---|---|---|
| 649,254 | 1/1951 | Great Britain. |

LEWIS H. MYERS, *Primary Examiner.*

D L. CLAY, *Assistant Examiner.*